(12) United States Patent
Inage et al.

(10) Patent No.: US 8,210,866 B2
(45) Date of Patent: Jul. 3, 2012

(54) OUTLET AND CONNECTOR

(75) Inventors: Toshiaki Inage, Suzuka (JP); Yukihiko Okamura, Hirakata (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/810,337

(22) PCT Filed: Dec. 26, 2008

(86) PCT No.: PCT/JP2008/073701
§ 371 (c)(1),
(2), (4) Date: Jul. 7, 2010

(87) PCT Pub. No.: WO2009/082001
PCT Pub. Date: Jul. 2, 2009

(65) Prior Publication Data
US 2010/0279532 A1 Nov. 4, 2010

(30) Foreign Application Priority Data

Dec. 26, 2007 (JP) .................................. 2007-335181

(51) Int. Cl.
*H01R 3/00* (2006.01)
(52) U.S. Cl. ......................................... 439/490; 439/188
(58) Field of Classification Search ................... 439/188, 439/489, 490
See application file for complete search history.

(56) References Cited

U.S. PATENT DOCUMENTS

| 4,094,565 | A  | * | 6/1978 | Parrier et al. | 439/106 |
| 6,350,148 | B1 | * | 2/2002 | Bartolutti et al. | 439/489 |
| 6,688,908 | B2 | * | 2/2004 | Wallace | 439/490 |

FOREIGN PATENT DOCUMENTS

| JP | 4-115765 U | 10/1992 |
| JP | 9-298076 A | 11/1997 |
| JP | 2004-31088 A | 1/2004 |

OTHER PUBLICATIONS

International Search Report for the Application No. PCT/JP2008/073701 mailed Jan. 27, 2009.

* cited by examiner

*Primary Examiner* — Khiem Nguyen
(74) *Attorney, Agent, or Firm* — Cheng Law Group, PLLC

(57) ABSTRACT

An outlet (1) includes a plurality of blade receiving members (13) adapted in use to be connected respectively to a plurality of DC supply lines (Wdc1 and Wdc2), and to be connected respectively to a plurality of blades (21) of an outlet plug (2). The outlet (1) is configured to supply DC power from the plurality of the DC supply lines (Wdc1 and Wdc2) to the outlet plug (2) via the plurality of the blade receiving members (13). The outlet (1) includes a wiring detecting means (3). The wiring detecting means (3) is configured to determine proper wiring when the plurality of the DC supply lines is connected respectively to the plurality of the blade receiving members at proper polarity, and to determine improper wiring when the plurality of the DC supply lines is connected respectively to the plurality of the blade receiving members at improper polarity.

6 Claims, 6 Drawing Sheets

FIG. 3
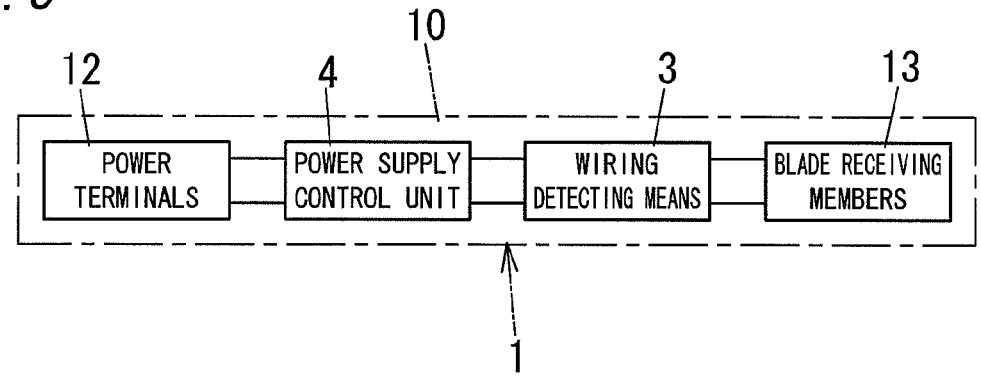
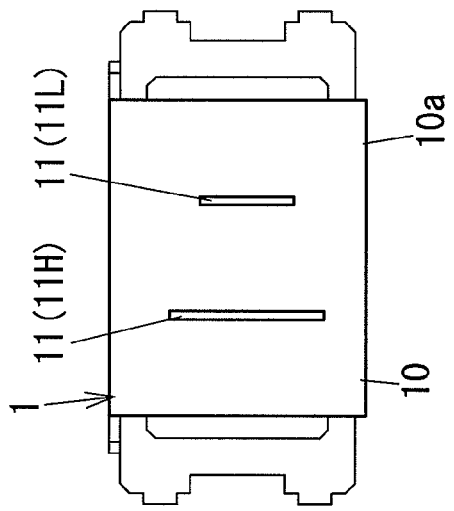
FIG. 4A
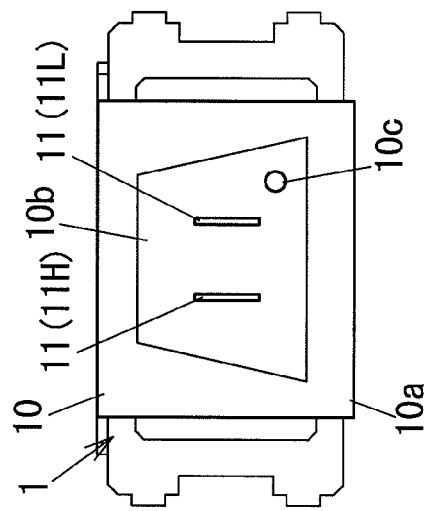
FIG. 4B
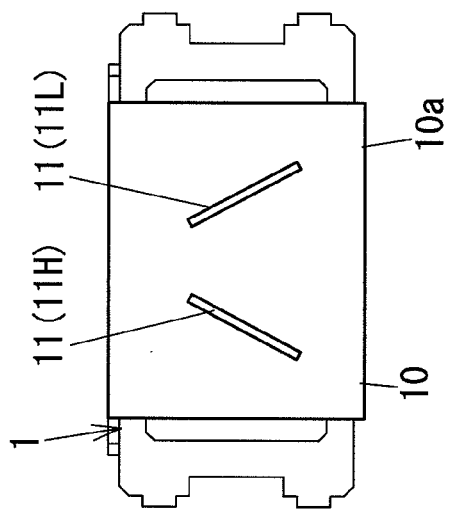
FIG. 4C
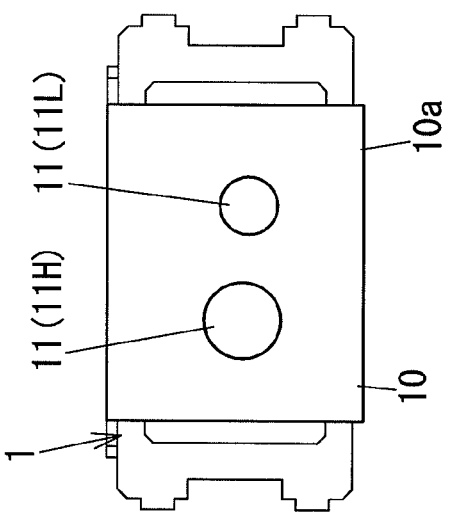
FIG. 4D

OUTLET AND CONNECTOR

TECHNICAL FIELD

The present invention is directed to an outlet and connector.

BACKGROUND ART

In the past, there has been proposed a connector interposed between a DC power source and a DC load (e.g. DC device and the like) and used for connecting a line to a cord, or cords to each other. An attachment connector which is one type of the connectors is capable of easily connecting a line to a cord, or cords to each other, by attaching an attachment plug (plug) to a plug receiving equipment, and/or is capable of easily separating a line from a cord, or cords from each other, by detaching the attachment plug from the plug receiving equipment. Especially, a plug receiving equipment which is fixed to a building part such as a wall, a device, or the like is called "outlet".

For example, Japanese Non-examined Patent Publication No. 2004-31088 discloses a wiring attachment connector including an outlet plug (plug) and an outlet. The outlet plug has a pair of blades (a high potential side blade and a low potential side blade), and the outlet (plug receiving equipment) has blade receiving members in a pair adapted in use to be connected respectively to the blades in the pair of the plug. Further, aforementioned Japanese Non-examined Patent Publication discloses the outlet has a blade insertion slot shaped into a shape where an existing insertion plug for AC power can not be inserted.

Although an AC power source alternates a high potential side (e.g. a positive electrode) and a low potential side (e.g. a negative electrode) periodically, a DC power source does not alternate a high potential side and a low potential side. Meanwhile, a DC load has a terminal for connecting to the high potential side of the DC power, and a terminal for connecting to the low potential side of the DC power. The DC load is activated by voltage applied between the aforementioned terminals.

In short, the DC load has polarity. Therefore, a user need be careful not to cause improper wiring (or improper connection) where the high and low potential sides are connected inversely, when the user connects an outlet to a DC power or connects an outlet plug to an outlet. When the high and low potential sides are connected inversely, inverse voltage is applied between the terminals of the DC load. The inverse voltage gives a stress to the DC load, and the DC suffering from the stress is likely to break.

However, when a user connects respectively two feeder wires (DC supply lines) of a DC power to terminals in a pair (a pair of terminals electrically connected to a pair of blade receiving members) of an outlet, the user is likely to connect the feeder wires to the terminals with inverting the high potential side and the low potential side. In short, the low potential side terminal of the outlet is likely to be connected to the high potential side feeder wire, and the high potential side terminal of the outlet is likely to be connected to the low potential side feeder wire.

When an outlet has blade receiving members or blade insertion slots having the same shape as each other, it is difficult to distinguish between polarities of each of the blade receiving members with reference to an exterior appearance. Therefore, though a user intends to connect a device to the information outlet having the terminal receiving member receiving DC power, the user is likely to mistakenly connect the device to the information outlet having the terminal receiving member not receiving DC power.

As described in the above, in the conventional outlet or connector, the improper wiring is likely to give harmful effect to a DC device.

DISCLOSURE OF INVENTION

In view of above insufficiency, the present invention has been aimed to provide an outlet capable of detecting improper wiring when a plurality of DC supply lines is connected respectively to a plurality of blade receiving members of an outlet at improper polarity, and capable of preventing the improper wiring from giving harmful effect to a DC device. The present invention has been also aimed to provide a connector capable of detecting the improper connection when a plug is connected to an outlet at improper polarity, and capable of preventing the improper connection from giving harmful effect to a DC device.

The outlet in accordance with the present invention includes a plurality of blade receiving members adapted in use to be connected respectively to a plurality of DC supply lines, and to be connected respectively to a plurality of blades of an outlet plug. The outlet is configured to supply DC power from the plurality of the DC supply lines to the outlet plug via the plurality of the blade receiving members. The outlet includes a wiring detecting means. The wiring detecting means is configured to determine proper wiring when the plurality of the DC supply lines is connected respectively to the plurality of the blade receiving members at proper polarity, and to determine improper wiring when the plurality of the DC supply lines is connected respectively to the plurality of the blade receiving members at improper polarity.

According to the present invention, the wiring detecting means can detect the improper wiring when the DC supply lines are connected at improper polarity to the blade receiving members. Thus, it is possible to easily determine whether or not the improper wiring occurs. Therefore, the outlet is capable of successfully preventing the improper wiring from giving harmful effect to a DC device.

In a preferred embodiment, the outlet includes an alarm configured to, when the wiring detecting means detects the improper wiring, make notification of the improper wiring.

According to this embodiment, the outlet is capable of notifying a user of the improper wiring upon detecting the improper wiring. Therefore, it is possible to successfully determine whether or not the improper wiring occurs.

In a preferred embodiment, the outlet includes a power supply control unit configured to supply DC power to the outlet plug when the wiring detecting means does not detect the improper wiring.

According to this embodiment, the power supply control unit terminates supplying power when the improper wiring is detected. Therefore, even when the outlet plug is connected to the outlet having the improper wiring, the outlet is capable of successfully preventing the improper wiring from giving harmful effect to a DC device.

The connector in accordance with the present invention includes an outlet plug including a plurality of blades, and an outlet including a plurality of blade receiving members. The connector is configured to supply DC power from the outlet to the outlet plug in a condition where the plurality of the blades of the outlet plug is connected respectively to the plurality of the blade receiving members of the outlet. The connector includes a connection detecting means. The connection detecting means is configured to determine proper connection when the plurality of the blades of the outlet plug are connected respectively to the plurality of the blade receiving members of the outlet at proper polarity, and to determine improper connection when the plurality of the blades of the outlet plug is connected respectively to the plurality of the blade receiving members of the outlet at improper polarity.

According to the present invention, the connection detecting means can detect the improper connection when a user connects the outlet plug to the outlet at the improper polarity. Thus, it is possible to easily determine whether or not the improper connection occurs. Therefore, the connector is capable of successfully preventing the improper connection from giving harmful effect to a DC device.

In a preferred embodiment, the connection detecting means is a magnet device comprising first magnets in a pair disposed adjacent to a surface of the outlet opposed to the outlet plug, and second magnets in a pair disposed adjacent to a surface of the outlet plug opposed to the outlet. The first magnets in the pair have polarities opposite to each other on the side of the outlet plug. The second magnets in the pair have polarities opposite to each other on the side of the outlet. The first magnets in the pair and the second magnets in the pair are arranged so as to attract each other only when the plurality of the blades of the outlet plug is connected respectively to the plurality of the blade receiving members of the outlet at proper polarity.

According to this embodiment, the first magnet and the second magnet attract each other when the outlet plug is connected to the outlet at the proper polarity. Meanwhile the first magnet and the second magnet repel each other when the outlet plug is connected to the outlet at the improper polarity. Therefore, it is possible to realize the connection detecting means by use of a simple configuration utilizing magnets.

In a preferred embodiment, the connector includes a power supply control unit configured to supply DC power to the outlet plug when the connection detecting means does not detect the improper connection.

According to this embodiment, the power supply control unit supplies power while the improper connection does not occur, and terminates supplying power when the improper connection occurs. Therefore, it is possible to successfully prevent the improper connection from giving harmful effect to a DC load.

BRIEF DESCRIPTION OF DRAWINGS

FIG. 3 is a block diagram illustrating an outlet in accordance with a second embodiment, FIG. 4A is a front view illustrating the aforementioned outlet, FIG. 4B is a front view illustrating the aforementioned outlet of another instance, FIG. 4C is a front view illustrating the aforementioned outlet of another instance, FIG. 4D is a front view illustrating the aforementioned outlet of another instance.

BEST MODE FOR CARRYING OUT THE INVENTION (First Embodiment)

Figure 1A:
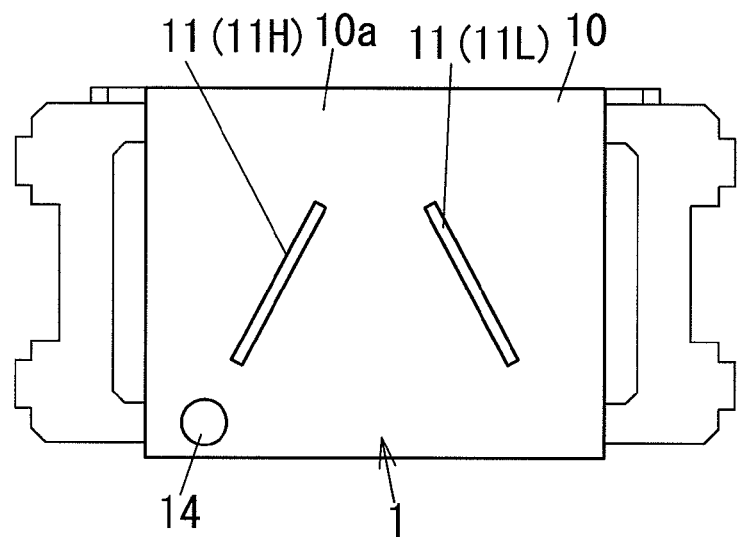
FIG. 1A is a front view illustrating an outlet in accordance with a first embodiment.
Figure 1B:
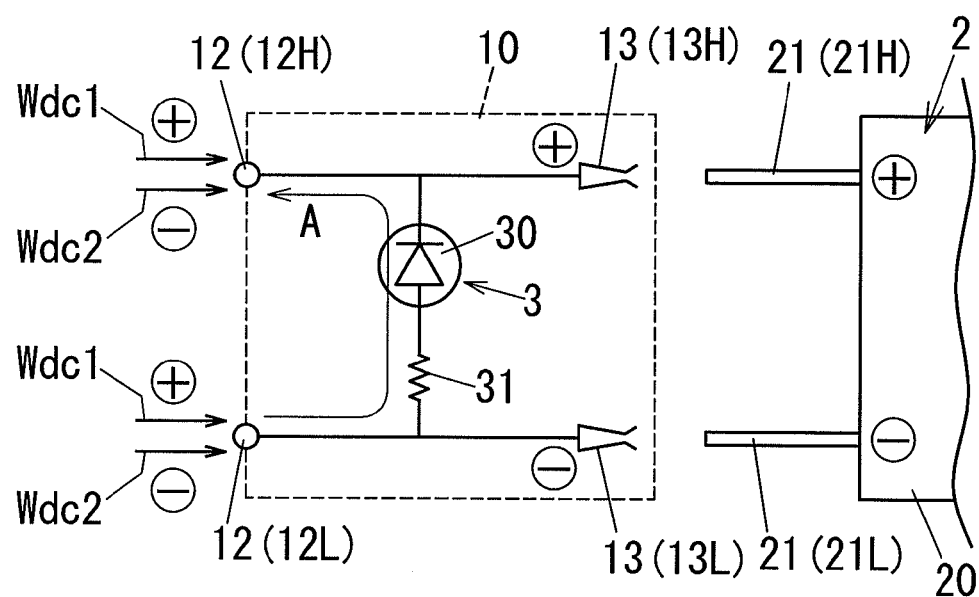
FIG. 1B is a circuit diagram illustrating the aforementioned outlet.

As shown in FIG. 1A, the outlet (socket) 1 in accordance with the present embodiment is a DC outlet used for supplying DC power. As shown in FIG. 1B, connected to the outlet 1 is an outlet plug (hereinafter called "plug") 2 which is an attachment plug for a DC power source.

The plug 2 includes a case 20 made of a dielectric resin (e.g. phenol resins) and shaped into a cuboid-shape. There is a plurality (two in the illustrated instance) of blades 21 protruding from a surface (front face) of the case 20. The blade 21 is made of metals and shaped into a rectangular plate shape. The blades 21 are spaced from each other at a distance which is greater towards one width end than the other width end of the blade 21.

One of the blades 21 is connected to a high potential side (positive electrode) of a DC power source (not shown), and another of the blades 21 is connected to a low potential side (negative electrode) of the DC power source. In the following explanation, the blade 21 connected to the high potential side of the DC power source is represented as the high potential side blade 21H, as necessary. Likewise, the blade 21 connected to the low potential side of the DC power source is represented as the low potential side blade 21L, as necessary.

Figure 7:
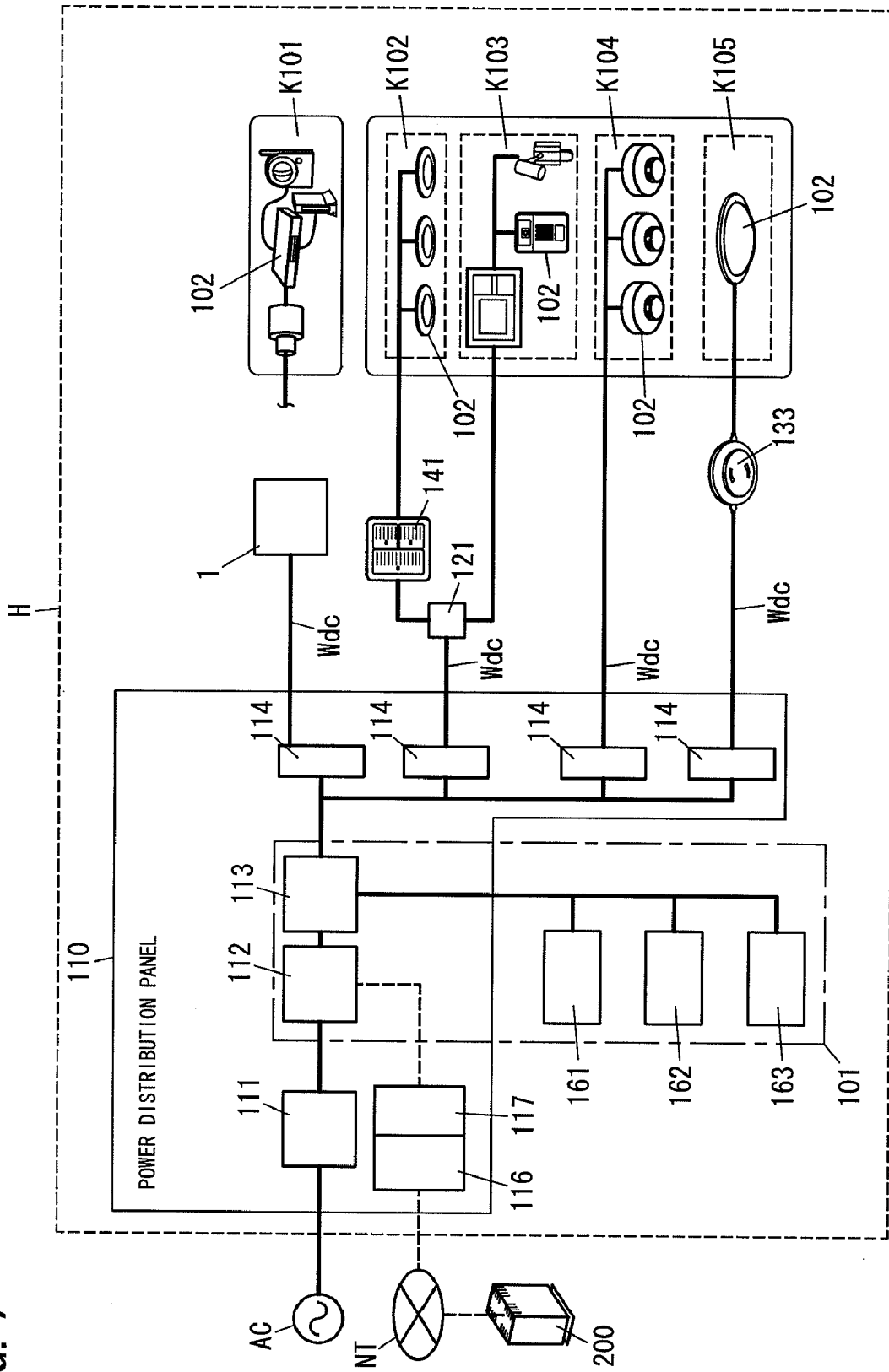
FIG. 7 is a schematic view illustrating a DC distribution system.

The plug 2 is directly or indirectly provided to a DC load such as a DC device 102 (see FIG. 7). In short, the DC device 102 receives a DC voltage applied between the blades 21H and 21L of the plug 2.

The outlet 1 includes a case 10 shaped into an approximately cuboid-shape, for example. The case 10 is a resin mold product made of a dielectric resin (e.g. phenol resins).

The case 10 is formed with a plurality (two in the illustrated instance) of blade insertion slot 11 in its front face 10a. Each of the blade insertion slots 11 is a rectangular shaped opening, and has dimensions enough to be inserted the blade 21 into. The high potential blade 21H is inserted into one (left blade insertion slot 11, in FIG. 1A) of the blade insertion slot 11, and the low potential blade 21L is inserted into another (right blade insertion slot 11, in FIG. 1B) of the blade insertion slot 11. In the following explanation, the reference number of the blade insertion slot 11 for being inserted the high potential side blade 21H is represented as 11H, and the reference number of the blade insertion slot 11 for being inserted the low potential side blade 21L is represented as 11L, as necessary. In conformity with the blades 21 of the plug 2, the blade insertion slots 11 are spaced from each other at a distance which is greater towards one width end (lower end in FIG. 1A) than the other width end (upper end in FIG. 1A) of the blade insertion slot. In short, the blade insertion slots 11 are formed in the front face 10a of the case 10 with one rotational symmetry.

The case 10 is formed in its rear surface with a plurality of electric wire insertion slots (not shown) which is adapted in use to be inserted a plurality (two in the illustrated instance) of feeder wires (DC supply line) Wdc1 and Wdc2 from the DC power source (not shown) respectively. The feeder wires Wdc1 and Wdc2 are connected to the high potential side and low potential side of the DC power source, respectively.

As shown in FIG. 1A, the case 10 is configured to house a plurality (two in the illustrated instance) of power terminals 12 and a plurality (two in the illustrated instance) of blade receiving members 13. One of the power terminals 12 is adapted in use to be connected to the feeder wire Wdc1 of the high potential side, and another of the power terminals 12 is adapted in use to be connected to the feeder wire Wdc2 of the low potential side. In the following explanation, the reference number of the power terminal 12 connected to the feeder wire Wdc1 is represented as 12H, as necessary. Likewise, the reference number of the power terminal 12 connected to the feeder wire Wdc2 is represented as 12L, as necessary. One of the blade receiving members 13 is electrically connected to the power terminal 12H, and another of the blade receiving members 13 is electrically connected to the power terminal 12L. In the following explanation, the reference number of the blade receiving member 13 connected to the power terminal 12H is represented as 13H, as necessary. Likewise, the reference number of the blade receiving member 13 connected to the power terminal 12L is represented as 13L, as necessary. It is noted that the each blade receiving member 13 is made by bending a metal plate. The above blade receiving member 13 may be made to have an equivalent configuration of conventional blade receiving member with necessary modification.

The outlet 1 includes a wiring detecting means 3. The wiring detecting means 3 is configured to determine proper wiring when the two feeder wires Wdc1 and Wdc2 are connected respectively to the two blade receiving members 13 (or the two power terminals 12) at proper polarity, and to determine improper wiring when the two feeder wires Wdc1 and Wdc2 are connected respectively to the two blade receiving members 13 (or the two power terminals 12) at improper polarity.

The wiring detecting means 3 of the present embodiment includes a light emitting diode 30 and a resistor 31, as shown in FIG. 1B. The light emitting diode 30 has its anode terminal electrically connected to the power terminal 12L and its cathode terminal electrically connected to the power terminal 12H. The light emitting diode 30 has its threshold voltage lower than a voltage of the DC power source. The resistor 31 is interposed between the anode terminal of the light emitting diode 30 and the power terminal 12L. The resistor 31 serves to prevent excess current from flowing through the light emitting diode 30.

While the feeder wire Wdc1 is connected to the power terminal 12H and the feeder wire Wdc2 is connected to the power terminal 12L (that is, the feeder wire Wdc1 is connected to the blade receiving member 13H and the feeder wire Wdc2 is connected to the blade receiving member 13L), the blade receiving member 13H is lower in electrical potential than the blade receiving member 13L. Therefore, no current flows through the light emitting diode 30, and the light emitting diode 30 does not emit light.

While the feeder wire Wdc2 is connected to the power terminal 12H and the feeder wire Wdc1 is connected to the power terminal 12L (that is, the feeder wire Wdc2 is connected to the blade receiving member 13H and the feeder wire Wdc1 is connected to the blade receiving member 13L), the blade receiving member 13H is higher in electrical potential than the blade receiving member 13L. Therefore, current flows through the light emitting diode 30 along a direction indicated by an arrow A shown in FIG. 1B, and the light emitting diode 30 emits light.

As apparent from the above, the light emitting diode 30 is kept turned off while establishing the proper wiring, and is turned on when establishing the improper wiring.

The case 10 is provided with in its front face 10a with a translucency window portion 14. The translucency window portion 14 is made of a translucency material passing light emitted from the light emitting diode 30. In the outlet 1, the light emitting diode 30 and the translucency window portion 14 are arranged such that light emitted from the light emitting diode 30 is transmitted to an outside of the case 10 via the translucency window portion 14. It is noted that the outlet 1 may include an optical member such as a prism configured to guide light emitted from the light emitting diode 30 to the translucency window portion 14.

As described in the above, the outlet 1 of the present embodiment includes the wiring detecting means 3. Accordingly, it is possible to easily determine whether or not the improper wiring occurs. As a result, the outlet is capable of successfully preventing the improper wiring from giving harmful effect to the DC device 102. Especially, the light emitting diode 30 is turned on when the feeder wires Wdc1 and Wdc2 are connected to the blade receiving members 13 at the improper polarity. Light emitted from the light emitting diode 30 is transmitted to the outside the case 10 via the translucency window portion 14. Accordingly, the outlet 1 is capable of notifying a user of the improper wiring upon detecting the improper wiring. Therefore, it is possible to successfully determine whether or not the miss wiring occurs. As described in the above, the wiring detecting means 3 acts as alarm configured to make notification of the improper wiring when the wiring detecting means 3 detects the improper wiring. Therefore, it is possible to simplify a circuit configuration of the outlet 1.

The configuration of the wiring detecting means 3 is not limited to the aforementioned instance. For example, the wiring detecting means 3 may have respective a configuration shown in FIG. 2B. The wiring detecting means 3 shown in FIG. 2B includes a diode 32 and a buzzer 33. The diode 32 has its anode terminal electrically connected to the power terminal 12L and its cathode terminal electrically connected to the power terminal 12H. The diode 32 has its threshold voltage lower than the voltage of the DC power source. The buzzer 33 is configured to generate predetermined sound (e.g. electronic sound) when energized. The buzzer 33 is interposed between the anode terminal of the diode 32 and the power terminal 12L.

Figure 2A:
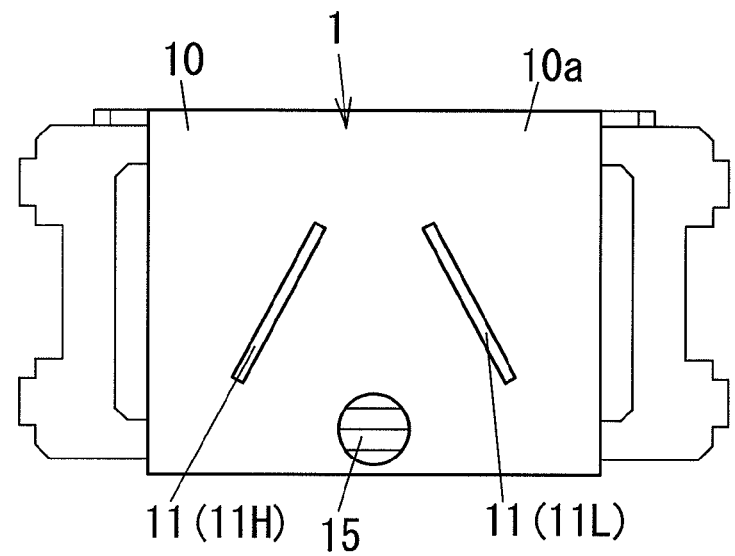
FIG. 2A is a front view illustrating the aforementioned outlet of another instance.

While the feeder wire Wdc1 is connected to the power terminal 12H and the feeder wire Wdc2 is connected to the power terminal 12L, no current flows through the diode 32. Thus, the buzzer 33 does not generate the electronic sound. While the feeder wire Wdc2 is connected to the power terminal 12H and the feeder wire Wdc1 is connected to the power terminal 12L, current flows through the diode 33 along a direction indicated by an arrow A shown in FIG. 2B. Thus, the buzzer 33 generates the electronic sound. As apparent from the above, the buzzer 33 generates the electronic sound only when establishing the improper wiring. As shown in FIG. 2A, the case 10 is provided with in its front face 10a with a sound hole 15 instead of the translucency window portion 14. The sound hole 15 serves to transmit the electronic sound generated by the buzzer 33 to the outside of the case 10.

Figure 2B:
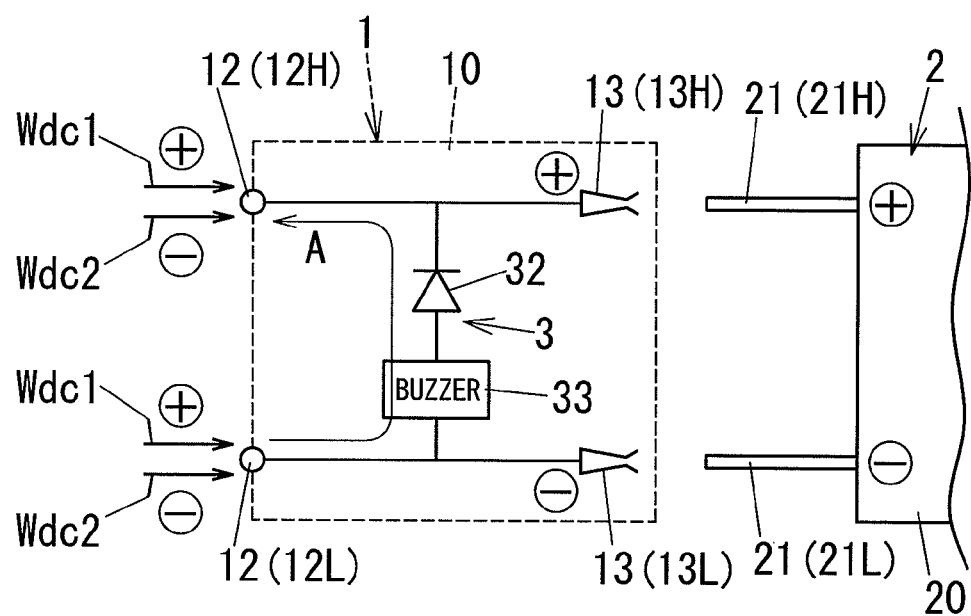
FIG. 2B is a circuit diagram illustrating the aforementioned outlet of another instance.

The outlet 1 shown in FIGS. 2A and 2B can produce the same effect as the aforementioned one.

(Second Embodiment)

As shown in FIG. 3, the outlet 1 of the present embodiment is different from the outlet 1 of the first embodiment in that the outlet 1 includes a power supply control unit 4. Other components of the outlet 1 of the present embodiment are the same as those of the first embodiment, respectively. Therefore the other components are designated by like reference numerals and dispensed with duplicate explanations.

The power supply control unit 4 is configured to supply no power to the plug 2 when the improper wiring is detected, and to supply power to the plug 2 while the improper wiring is not detected. A detailed explanation is made to the power supply unit 4 below. The power supply control unit 4 includes a relay (not shown) configured to open or close a power line between the terminal 12 and the blade receiving member 13. For example, an electromagnetic relay can be adopted as the aforementioned relay. The aforementioned relay is not limited to the electromagnetic relay. In short, a semiconductor switching device (e.g. a transistor and the like) also can be adopted as the aforementioned relay.

When the electromagnetic relay is provided as a normally close type, a diode or the like is used to energize a coil (not shown) of the electromagnetic relay in response to the improper wiring, and de-energize the same in response to the proper wiring. In this instance, the electromagnetic relay closes its contacts when the proper wiring is made, and opens its contacts when the improper wiring is made. In short, the power terminal 12 is electrically connected to the blade receiving member 13 only when the plurality of the feeder wire Wdc1 and Wdc2 is connected respectively to the plurality of the blade receiving members 13 at the proper polarity.

When the electromagnetic relay is provided as a normally open type, a diode or the like is utilized to energize the coil (not shown) of the electromagnetic relay in response to the proper wiring, and de-energize the coil in response to the improper wiring. In this instance, the power terminal 12 is electrically connected to the blade receiving member 13 only when the plurality of the feeder wire Wdc1 and Wdc2 is connected respectively to the plurality of the blade receiving members 13 at the proper polarity.

In the above configuration, the aforementioned diode is used as the wiring detecting means configured to judge whether or not the plurality of the feeder wire Wdc1 and Wdc2 is connected respectively to the plurality of the blade receiving members 13 at the proper polarity. In this instance, the light emitting diode 30 of the wiring detecting means 3 (see FIG. 1B) or the diode 32 (see FIG. 2B) can be adopted instead of the aforementioned diode.

As described in the above, the outlet 1 of the present embodiment includes the wiring detecting means 3, thereby producing the same effect as the outlet 1 of the first embodiment.

Further, in the outlet 1 of the present embodiment, the power supply control unit 4 supplies power only when the plurality of the feeder wire Wdc1 and Wdc2 is connected respectively to the plurality of the blade receiving members 13 at the proper polarity. In short, the power supply control unit 4 terminates supplying power when the plurality of the feeder wire Wdc1 and Wdc2 is connected respectively to the plurality of the blade receiving members 13 at the improper polarity. Even when the plug 2 is connected to the outlet 1 having the improper polarity, it is possible to prevent the improper wiring from giving the harmful effect to the DC device 102. Accordingly, the outlet 1 of the present embodiment can give an additional improvement of avoiding the harmful effect to the DC device 102 upon occurrence of the improper wiring, as compared to the outlet 1 of the first embodiment.

By the way, the plug 2 is likely to be connected to the outlet at improper polarity, and this causes improper connection. FIGS. 4A to 4D show instances configured to prevent occurrence of the improper connection, respectively.

In the outlet 1 shown in FIG. 4A, as described in the first embodiment, the distance between the blade insertion slots 11 is made greater towards one width end (lower end, in FIG. 4A) than the other width end (upper end in FIG. 4A) of the slot. In the outlet 1 shown in FIG. 4B, although the blade insertion slots 11 in the pair are parallel to each other, the blade insertion slot 11H is greater in length than the blade insertion slot 11L. In the outlet 1 shown in FIG. 4C, although the blade insertion slots 11 in the pair are shaped into a circular shape, the blade insertion slot 11H is greater in inner diameter than the blade insertion slot 11L.

In instance shown in respective FIGS. 4A to 4B, the pair of the blade insertion slots 11 is formed in the front face 10a of the case 10 in order to have one rotational symmetry. Therefore, in the respective instances of FIGS. 4A to 4B, the outlet 1 permits the plug 2 to be connected in only one orientation. Thus, it is possible to prevent occurrence of improper connection of the plug 2. The blade receiving members 13 of the outlet 1 and the plug 2 respectively are shaped into a shape corresponding to the shape of the blade insertion slot 11 shown in FIG. 4A, for example.

In the outlet 1 shown in FIG. 4D, the blade insertion slots 11 in the pair are shaped into the same shape as each other and parallel to each other. In short, the pair of the blade insertion slots 11 is formed in the front face 10a of the case 10 with two rotational symmetry. However, in the instance shown in FIG. 4D, the case 10 is formed in its front face 10a with a fitting recess 10b. The blade insertion slots 11 in the pair are formed in a bottom of the fitting recess 10b. FIG. 4D shows the fitting recess 10b shaped into a trapezoidal shape. However, the fitting recess 10b may be shaped into a shape with one rotational symmetry. In this case, the case 20 of the plug 2 is shaped into a shape capable of being fitted into the fitting recess 10b.

Therefore, also in the instance of FIG. 4D, the outlet 1 permits the plug to be connected in only one orientation. Thus, it is possible to prevent occurrence of improper connection of the plug 2. Further, FIG. 4D shows a recess 10c formed in the bottom of the fitting recess 10b. The case 20 of the plug 2 is formed on its front face with a protrusion (not shown) configured to, when the proper connection is made, be fitted into the recess 10c. Therefore, it is possible to give an additional improvement of preventing the occurrence of the improper connection.

(Third Embodiment)

Figure 5A:
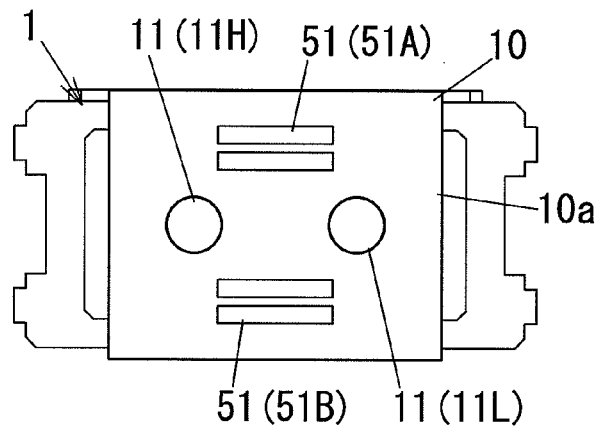
FIG. 5A is a front view illustrating of an outlet of a connector in accordance with a third embodiment.
Figure 5B:
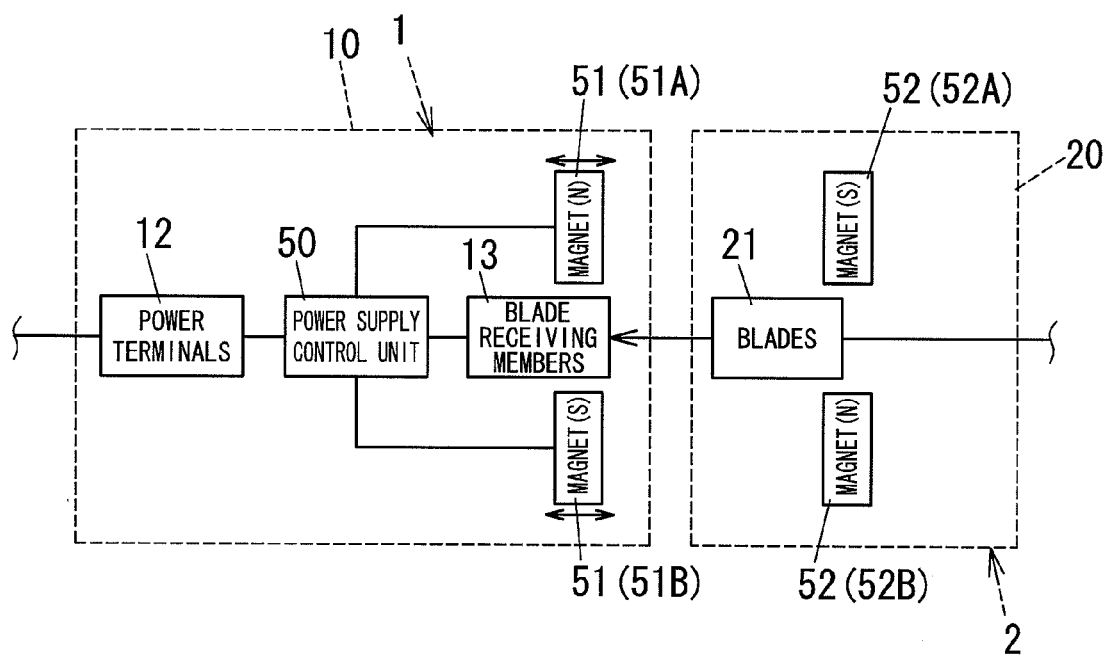
FIG. 5B is a block diagram illustrating the aforementioned connector.
Figure 5C:
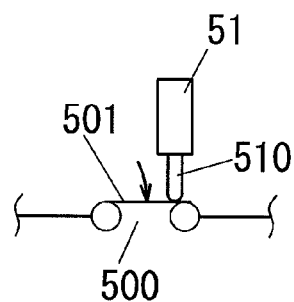
FIG. 5C is an explanatory view showing the aforementioned connector.

There is a connector in accordance with the present embodiment shown in FIG. 5B. The connector of the present embodiment includes the plug 2 including the plurality (two in the illustrated instance) of the blades 21 and the outlet 1 including the plurality (two in the illustrated instance) of the blade receiving members 13. The connector is configured to supply DC power from the outlet 1 to the plug 2 in a condition where the plurality of the blades 21 of the plug 2 is connected respectively to the plurality of the blade receiving members 13 of the outlet 1.

As shown in FIG. 5B, although the outlet 1 of the present embodiment includes the same case 10 as that of the first embodiment, the blade insertion slots 11 in the pair of the present embodiment are shaped into a circular shape same as each other and are parallel to each other.

As shown in FIG. 5B, the case 10 of the present embodiment houses the power terminals 12, the blade receiving members 13, a switching unit 50, and a pair of first magnets 51. Since the power terminals 12 and blade receiving members 13 are the same as those of the first embodiment, an explanation concerning the power terminals 12 and blade receiving members 13 is omitted in the present embodiment.

The switching unit 50 is provided to a power line interposed between the power terminals 12 and the blade receiving members 13. The switching unit 50 of the present embodiment includes a pair of switches 500. One of the switches 500 in the pair is interposed between the power terminal 12H and the blade receiving member 13H, and another of the switches 500 in the pair is interposed between the power terminal 12L and the blade receiving member 13L. Each of switches 500 is of normally open type, and is closed when an operation piece 501 is pressed.

As shown in FIG. 5A, the pair of the first magnets 51 is exposed from the front face 10a of the case 10. In short, the pair of the first magnets 51 is disposed adjacent to a surface (front face 10a) of the outlet 1 opposed to the plug 2. The first magnets 51 in the pair are respectively disposed on opposite sides of the blade insertion slots 11 in a width direction (vertical direction in FIG. 5A) of the case 10. In the following explanation, in order to distinguish the first magnets 51 in the pair, the reference numbers 51A and 51B are used, as necessary.

The first magnet 51A is disposed so as to have its north pole exposed from the front face 10a of the case 10. The first magnet 51B is disposed so as to have its south pole exposed from the front face 10a of the case 10. In short, the first magnets 51 in the pair have polarities opposite to each other on the side of the plug 2.

The first magnets 51 in the pair are attached to the case 10 such that each of the first magnets 51 moves along forward and rearward relative to the case 10. Further, a slide piece 510 is attached to each of the first magnets 51, and is adapted in use to press the operation piece 501 of the switch 500. The first magnets 51 and the switches 500 are positioned such that the slide piece 510 presses the operation piece 501 to turn on the switch 500 when the first magnet 51 is located on the side of the front face 10a of the case 10, and such that the slide piece 510 does not press the operation piece 501 to turn off the switch 500 when the first magnet 51 is located on the side of the rear surface of the case 10. There are return springs (not shown) configured to bias the first magnets 51 to the rear surface side of the case 10.

As shown in FIG. 5B, the plug 2 in accordance with the present embodiment includes the same case 20 as that of the second embodiment. There are the blades 21 and a pair of second magnets 52 provided to the case 20. The blades 21 are the same as those of the first embodiment with the exception of being shaped into a column shape.

The pair of the second magnets 52 is exposed from the front face of the case 20. In short, the pair of the second magnets 52 is disposed adjacent to a surface (front face) of the plug 2 opposed to the outlet 2. In the following explanation, in order to distinguish the second magnets 52 in the pair, the reference numbers 52A and 52B are used, as necessary.

The second magnet 52A is disposed so as to have its south pole exposed from the front face of the case 20. The second magnet 52B is disposed so as to have its north pole exposed from the front face of the case 20. In short, the second magnets 52 in the pair have polarities opposite to each other on the side of the outlet 1.

The second magnets 52 in the pair respectively are positioned such that the second magnets 52 in the pair are respectively opposed to the first magnets 51 in the pair when the plug 2 is connected to the outlet 1. Especially, the second magnets 52 in the pair are positioned such that the second magnet 52A is opposed to the first magnet 51A and the second magnet 52B is opposed to the first magnet 51B when the plug 2 is connected to the outlet 1 at the proper polarity. In short, when the plug 2 is connected to the outlet 1 at the proper polarity, the second magnet 52A having its south pole on the side of the outlet 1 is opposed to the first magnet 51A having its north pole on the side of the plug 2, and the second magnet 52B having its north pole on the side of the outlet 1 is opposed to the first magnet 51B having its south pole on the side of the plug 2. Therefore, the second magnets 52 in the pair and the first magnets 51 in the pair respectively attract each other.

As described in the above, each of the first magnets 51 is allowed to move forward and rearward relative to the case 10. Therefore, each of the first magnets 51 moves forwardly of the case 10 when the plug 2 is connected to the outlet 1 at the proper polarity. An attraction force developed between the first magnet 51 and the second magnet 52 is selected to move the first magnet 51 forwardly of the case 10 against bias of the return spring.

When the first magnets 51 are moved forwardly of the case 10, the switches 500 are turned on. Therefore, the power terminals 12 are electrically connected to the corresponding power receiving members 13. Thus, the outlet 1 can supply power to the plug 2.

Figure 5D:
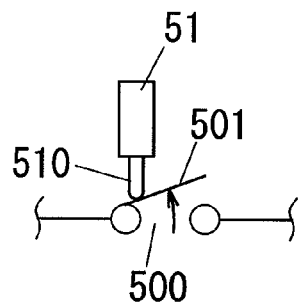
FIG. 5D is an explanatory view showing the aforementioned connector.

After the plug 2 is detached from the outlet 1, the first magnets 51 are not attracted to the second magnets 52. Thus, the bias of the return springs moves the first magnet 51 rearwardly of the case 10. Therefore, the switches 500 are turned off, as shown in FIG. 5D. In this case, the power terminals 12 are electrically insulated from the blade receiving members 13.

Meanwhile, while the plug 2 is connected to the outlet 1 at the improper polarity (at the time that the improper connection is made), the second magnet 52B is opposed to the first magnet 51A as well as the second magnet 52A is opposed to the first magnet 51B. In short, the second magnet 52B having its north pole on the side of the outlet 1 is opposed to the first magnet 51A having its north pole on the side of the plug 2, and the second magnet 52A having its south pole on the side of the outlet 1 is opposed to the first magnet 51B having its south pole on the side of the plug 2. Therefore, the second magnets 52 in the pair and the first magnets 51 in the pair respectively repel each other.

In this instance, the first magnets 51 respectively are kept positioned rearwardly of the case 10. Even if the plug 2 is connected to the outlet 1 against repulsion between the first magnets 51 and the second magnets 52, the switches 500 respectively are kept turned off. Therefore, no power is supplied to the plug 2 from the outlet 1.

In the aforementioned connector, the switching unit 50, the pair of the first magnets 51, and the pair of the second magnets 52 constitute a connection detecting means. The connection detecting means is configured to determine the proper connection when the plurality of the blades 21 of the plug 2 is connected respectively to the plurality of the blade receiving members 13 of the outlet 1 at the proper polarity, and to determine the improper connection when the plurality of the blades 21 of the plug 2 is connected respectively to the plurality of the blade receiving members 13 of the outlet 1 at the improper polarity.

According to the connector of the present embodiment, the connection detecting means can detect the improper connection when a user connects the plug 2 to the outlet 1 at the improper polarity. Thus, it is possible to easily determine whether or not the improper connection occurs. Therefore, the connector is capable of successfully preventing the improper connection from giving harmful effect to the DC device 102.

Especially, in the present embodiment, the connection detecting means is a magnet device including the first magnets 51 in the pair disposed adjacent to the surface of the outlet 1 opposed to the plug 2, and the second magnets 52 in the pair disposed adjacent to the surface of the plug 2 opposed to the outlet 1. The first magnets 51 in the pair have polarities opposite to each other on the side of the plug 2. The second magnets 52 in the pair have polarities opposite to each other on the side of the outlet 1. The first magnets 51 in the pair and the second magnets 52 in the pair are arranged so as to attract each other only when the plurality of the blades 21 of the plug 2 is connected respectively to the plurality of the blade receiving members 13 of the outlet 1 at proper polarity.

Accordingly, the first magnet 51 and the second magnet 52 attract each other when the plug 2 is connected to the outlet 1 at the proper polarity. Meanwhile the first magnet 51 and the second magnet 52 repel each other when the plug 2 is connected to the outlet 1 at the improper polarity. Therefore, the connection detecting means can be constructed by use of a simple configuration utilizing magnets.

Moreover, in the present embodiment, the connection detecting means functions as the power supply control unit. The power supply control unit is configured to supply DC power to the plug 2 when the connection detecting means does not detect the improper connection. In short, the power supply control unit supplies power while the improper connection does not occur, and terminates supplying power when the improper connection occurs. Therefore, it is possible to successfully prevent the improper connection from giving harmful effect to the DC load 102.

Figure 6:
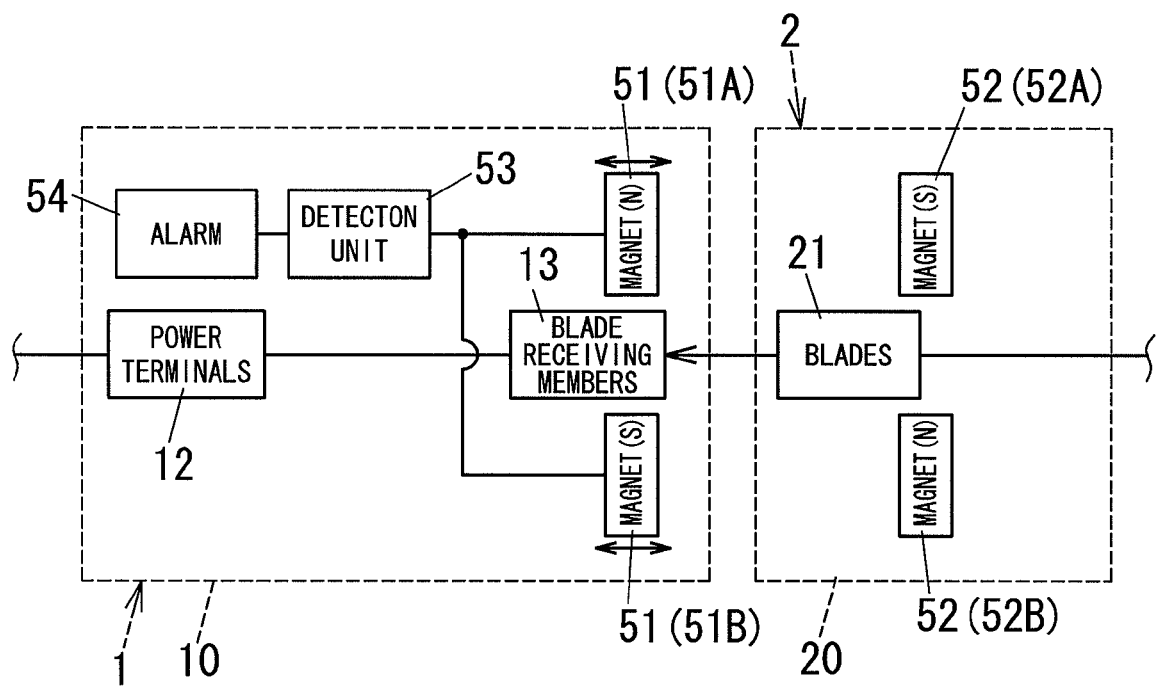
FIG. 6 is a block diagram illustrating the aforementioned connector of another instance.

FIG. 6 shows another instance of the connector of the present embodiment. The connector shown in FIG. 6 is the same as the connector shown in FIG. 5 with the exception of the outlet 1.

The outlet 1 shown in FIG. 6 includes the same case 10 as that of the instance shown in FIG. 5. The case 10 houses the power terminals 12, the blade receiving members 13, the first magnets 51 in the pair, a detection unit 53, and an alarm 54. The first magnets 51 in the pair are the same as those of the instance shown in FIG. 5. It is noted that the return spring is configured to bias the first magnets 51 towards not the rear side of the case 10 but the front side of the case 10.

The detection unit 53 is configured to detect the improper connection by use of the first magnets 51 in the pair. For example, the detection unit 53 includes a pair of detection switches (not shown). Each of the detection switches is of normally open type configured to be turned on when its manipulator (not shown) is pressed, for example. Further, the detection switch is configured to be turned on when the first magnet 51 is positioned on front side of the case 10, and to be turned off when the first magnet 51 is positioned on the rear side of the case 10. In the instance shown in FIG. 6, the return spring is configured to bias the first magnets 51 toward the front side 10a of the case 10. Therefore, each of the detection switches is kept turned on before the plug 2 is connected to the outlet 1. Further, when the plug 2 is connected to the outlet 1 at the proper connection, the first magnets 51 and the second magnets 52 attract with each other with the first magnets 51 kept stationary. Therefore, each of the detection switches is kept turned on.

Meanwhile, when the plug 2 is connected to the outlet 1 at the improper polarity (at the time that the improper connection is made), as described in the above, the second magnets 52 in the pair and the first magnets 51 in the pair respectively repel each other. In this case, the first magnets 51 are moved rearwardly of the case 10. Therefore, each of the detection switches is turned off. A repulsion force developed between the first magnet 51 and the second magnet 52 is selected to move the first magnet 51 rearward of the case 10 against bias of the return spring.

The detection unit 53 is configured to determine the improper connection when the detection switch is turned off. The detection unit 53 is configured to activate the alarm 54 upon determining the improper connection. For example, the light emitting diode 30 or the buzzer 33 mentioned in the first embodiment may be adopted as the alarm 54. The alarm 54 is not limited to the aforementioned instance, and may be a device which notifies a user by use of auditory stimulation, visual stimulation, or the like. Although the detection switch is turned off in response to the improper connection, the detection switch may be configured to be turned on in response to the improper connection. In this case, the detection switch can be used as the switch for driving the alarm 54. Therefore, it is possible to simplify the configuration of the connector.

As described in the above, the connector shown in FIG. 6 can notify a user of the improper connection by use of the alarm 54 when the improper connection is detected.

The above-mentioned connector of the present invention can be used in a DC distribution system shown in FIG. 7, for example. In FIG. 7, a house H of a single-family dwelling is exemplified as a building where the DC distribution system is applied. However, the DC distribution system can be applied to a housing complex.

There are a DC power supply unit 101 configured to output DC power and the DC device 102 placed in the house H. The DC device 102 is a load activated by DC power. DC power is supplied to the DC device 102 via a DC supply line Wdc connected to an output terminal of the DC power supply unit 101. There is a DC breaker 114 interposed between the DC power supply unit 101 and the DC device 102. The DC breaker 114 is configured to monitor current flowing through the DC supply line Wdc and to limit or terminate electrical power supply from the DC power supply unit 101 to the DC device 102 via the DC supply line Wdc upon detecting an abnormal state.

The DC supply line Wdc is adopted as a power line for DC power as well as a communication line. For example, it is possible to communicate between devices connected to the DC supply line Wdc by means of superimposing on a DC voltage a communication signal used for transmitting a data and made of a high-frequency carrier. This technique is similar to a power line communication technique where a communication signal is superimposed on an AC voltage applied to a power line for supplying an AC power.

The aforementioned DC supply line Wdc is connected to an information breaker 116 via the DC power supply unit 101. The information breaker 116 is a primary device for constructing a home communication network (hereinafter called "home network"). The information breaker 116 is configured to communicate with a subsystem constructed by the DC device 102 in the home network, for example.

In the instance shown in FIG. 7, an information system K101, lighting systems K102 and K105, an entrance system K103, and a home alarm system K104 are adopted as the subsystem. The each subsystem is an autonomous distributed system, and operates by itself. The subsystem is not limited to the aforementioned instance.

The DC breaker 114 is associated with the subsystem. In the instance shown in FIG. 7, each of the information system K101, a pair of the lighting system K102 and entrance system K103, the home alarm system K104, and the lighting system K105 is associated with one DC breaker 114. A connection box 121 is provided to associate one DC breaker 114 with a plurality of the subsystems. The connection box 121 is configured to divide a system of the DC supply line for each subsystem. In the instance shown in FIG. 7, the connection box 121 is interposed between the lighting system K102 and the entrance system K103.

The information system K101 includes the informational DC device 102 such as a personal computer, a wireless access point, a router, and an IP telephone transceiver. This DC device 102 is connected to a DC socket 131 preliminarily provided to the house H (provided at the time of constructing the house H) as a wall outlet or a floor outlet, for example.

Each of the lighting systems K102 and K105 includes the lighting DC device 102 such as a lighting fixture. In the instance shown in FIG. 7, the lighting system K102 includes the lighting fixture (DC device 102) preliminarily provided to the house H. It is possible to send a control instruction to the lighting fixture of the lighting system K102 by use of an infrared remote controller. Further, the control instruction can be sent by transmitting a communication signal from a switch 141 connected to the DC supply line Wdc. In short, the switch 114 has a function of communicating with the DC device 102. In addition, the control instruction can be sent by transmitting a communication signal from the home server 116 or other DC device 102 of the home network. The control instruction for the lighting fixture indicates such as turning on, turning off, dimming, and blinking. Meanwhile, the lighting system K105 includes the lighting fixture (DC device 102) connected to a ceiling-mounted hooking receptacle 133 preliminarily provided on a ceiling. It is noted that the lighting fixture is attached to the ceiling-mounted hooking receptacle 133 by a contractor at the time of constructing an interior of the house H or attached to the ceiling outlet 133 by a resident of the house H.

The entrance system K103 includes the DC device 102 configured to respond to a visitor and to monitor an intruder.

The home alarm system K104 includes the alarming DC device 102 such as a fire alarm.

Any DC device 102 can be connected to each of the aforementioned outlet 1 and ceiling-mounted hooking outlet 133. Each of the outlet 1 and ceiling-mounted hooking receptacle 133 outputs DC power to the connected DC device 102. Therefore, the outlet 1 and ceiling-mounted hooking receptacle 133 are hereinafter collectively called the "DC outlet", when a distinction between the outlet 1 and the ceiling-mounted hooking receptacle 133 is unnecessary. A case of the DC outlet has a connection slot (plug-in connection slot) for inserting a terminal of the DC device 102. A terminal receiving member configured to directly contact to the terminal which is inserted into the connection slot is housed in the case of the DC outlet. In short, the DC outlet with above mentioned configuration makes contact-type power supply. The DC device with a communication function is capable of transmitting a communication signal via the DC supply line Wdc. The communication function is provided to not only the DC device 102 but also DC outlet. It is noted that the terminal is directly attached to the DC device 102 or is attached to the DC device 102 via a connection wire.

The information breaker 116 is connected to not only the home network but also the wide area network NT constructing Internet. While the information breaker 116 is connected to the wide area network NT, a user can enjoy service provided by a center server (computer server) 200 connected to the wide area network. The information breaker 116 is connected to the wide area network NT via a router (not shown) having a function of a DHCP server.

The center server 200 provides service capable of monitoring or controlling a device (which is mainly the DC device 102, but which may be other apparatus having a communication function) connected to the home network via the wide area network NT, for example. The service enables monitoring or controlling a device connected to the home network by use of a communication terminal (not shown) having a browsing function such as a personal computer, an internet TV, and a mobile telephone equipment.

The information breaker 116 has a function of a communication middleware for communicating with the center server 200 and a function of a network security for connecting the wide area network NT. The information breaker 116 further has a function of time synchronization and a function of collecting identification information (assumed as "IP address" in this instance) concerning a device connected to the home network.

The communication middleware need have both a function of communicating with the center server 200 connected to the wide area network NT and a function of communicating with a device connected to the home network.

Now, an explanation is made to the function of communicating with the center server 200. The home device establishes periodically one-way polling communication, thereby verifying whether or not contents are stored in the center server 200. The center server 200 generates and stores contents upon receiving a monitoring request or controlling request from an information terminal connected to the wide area network NT. When the home device establishes the one-way polling communication while contents are stored in the center server 200, the center server 200 transmits the monitoring request or controlling request to the home device. Upon receiving a response to this request, the center server transmits the response to the information terminal. Accordingly, it is possible to monitor or control the home device by use of the information terminal.

When an event (such as fire detection) of which the home device should notify the information terminal occurs, the home device notifies the center server 200 of occurrence of the event. When the center server 200 is notified of the occurrence of the event by the home device, the center server 200 notifies the information terminal of the occurrence of the event by use of an e-mail. It is noted that a signal transmitted to the center server 200 is encrypted by means of SSL (Secure Sockets Layer Protocol). Further, the center server 200 is multiplexed such that one center server 200 functions instead of another center server 200 suffering from a communication error.

A function of communicating with the home network of the information breaker 116 includes an important function of detecting and managing a device constructing the home network. By means of utilizing UPnP (Universal Plug and Pray), the information breaker 116 automatically detects a device connected to the home network. The information breaker 116 further includes a display device 117 having a browsing function, and controls the display device 117 to display a list of the detected device. The display device 117 includes a touch panel or another user interface unit. Therefore, it is possible to select a desired one from options displayed on a screen of the display device 117. Accordingly, a user (a contractor or a resident) of the information breaker 116 can monitor and control the device through the screen of the display device 117. The display device 117 may be separated from the information breaker 116.

Each device connected to the home network is configured to transmit an entry packet upon entering the home network (upon being connected to the home network or upon activating after being connected to the home network). The information breaker 116 receives the enter packet, thereby determining types or functions of the device entering the home network. The device sets automatically own address (e.g. IP address). When a DHCP server is provided, the device obtains own address from the DHCP server. Moreover, each device has a function of transmitting an existence acknowledgement response packet. Upon receiving an existence acknowledgement packet from the information breaker 116, the device judges whether or not own configuration (e.g. own address) has been changed. Upon judging that own configuration has been changed, the device transmits the existence acknowledgement response packet including a state variation notification flag.

The information breaker 116 manages information with relation to connection of a device. For example, the information breaker 116 stores types or functions and an address of the device connected to the home network by receiving the entry packet and existence acknowledgement response packet.

When an event occurs at a device connected to the home network, occurrence of the event is notified the information breaker 116 of. In this case the information breaker 116 establishes a unicast communication to transmit an event packet generated at an application layer to the device under control of the information breaker 116 with reference to types or functions of the device. The device judges contents of the event packet transmitted from the information breaker 116. The device operates corresponding to the event packet when the contents of the event packet are important, and the device discards the event packet when the contents of the event packet are dispensable. Accordingly, the devices connected to the home network can make a linked operation. For example, a lighting fixture, which is one of the devices, is caused to turn on and off by manipulation of a switch, which is another of the devices.

Further, in order to make the cooperative operation of the devices, an information terminal such as a personal computer may be connected to the home server 116 and an association between the devices can be made by use of a browsing function of the information terminal. Each of the devices holds a relation with regard to the linked operation between the devices. Therefore, the devices can make the linked operation without requiring to access to the information breaker 116. After establishing an association with regard to the linked operation of respective devices, a lighting fixture, which is one of the devices, is caused to turn on and off by manipulation of a switch, which is another of the devices, for example. Although the association with regard to the linked operation is made for devices belonging to the same subsystem, the association with regard to the linked operation may be made for devices belonging to the different subsystems. For example, when the home alarm system K104 detects a fire, the lighting system K102 can be blinked in order to alert a resident, or can be turned on in order to indicate an escape route.

Next, a brief explanation is made to a network security function of the information breaker 116. The center server 200 communicates with the home devices via the information breaker 116. The information breaker 116 controls a session of a communication between the home device and the center server 200 by use of a fire wall function corresponding to the SPI (Stateful Packet Inspection). Therefore, the information breaker 116 detects an unauthorized access from the wide area network NT, and discards an unauthorized packet. The information breaker 116 further limits access by use of a MAC address, thereby banning access from an unregistered information terminal.

As explained in the above, the information breaker 116 provides a service managing for the cooperative operation of the devices connected to the home network and a service monitoring and controlling the device by use of the information terminal having the browsing function. In short, the information breaker 116 functions as a home server for the home network.

The DC supply unit 101 is configured to basically generate DC power from AC power supplied from an AC power source (for example a commercial power source located outside) AC. In the instance shown in FIG. 7, the AC power source AC is connected to an AC/DC converter 112 including a switching regulator via a main breaker 111. The main breaker 111 is embedded in a distribution board 110. DC power output from the AC/DC converter 112 is supplied to each DC breaker 114 via a cooperation control unit 113.

The DC supply unit 101 is provided with a secondary cell 162 in view of a period (blackout period of the commercial power source) in which the DC supply unit 101 fails to receive electrical power from the AC power source AC. A solar cell 161 and fuel cell 163 configured to generate DC power can be used together with the secondary cell 162. The solar cell 161, secondary cell 162, and fuel cell 163 respectively are a dispersed power source in view of a main power source including the AC/DC converter 112. In the instance shown in FIG. 7, the solar cell 161, secondary cell 162, and fuel cell 163 respectively include a circuit unit configured to control its output voltage. The solar cell 161 further includes not only a circuit unit of controlling electrical discharge but also a circuit unit of controlling electrical charge.

Although the solar cell 161 and fuel cell 163 of the dispersed power sources are dispensable, the secondary cell 162 is preferred to be provided. The secondary cell 162 is charged by the main power source or the other dispersed power source at the right time. The secondary cell 162 is discharged during a period in which the DC supply unit 101 fails to receive electrical power from the AC power source AC. In addition, the secondary cell 162 is discharged at the right time as necessary. The cooperation control unit 113 is configured to control discharge and charge of the secondary cell 162 and to make cooperation between the main power source and the dispersed power source. In short, the cooperation control unit 113 functions as a DC power control unit configured to control distributing to the DC device 102 electrical power from the main power source and dispersed power source constituting the DC supply unit 101. It is noted that DC power from the solar cell 161, secondary cell 162, and fuel cell 163 may be input to the AC/DC converter 112 by converting into AC power.

A drive voltage of the DC device 102 is selected from different voltages (e.g. 5V, 12V, 24V, 48V, and the like) respectively suitable to individual devices of different voltage requirements. For this purpose, the cooperation control unit 113 is preferred to include a DC/DC converter configured to convert DC voltage from the main power source and dispersed power source into a desired voltage. Normally, a fixed voltage is applied to one subsystem (or the DC device 102 connected to one particular DC breaker 114). However, different voltages may be selectively applied to one subsystem by use of three or more lines. Use of two wired DC supply line Wdc can vary the voltage applied between wires with time. The DC/DC converter can be placed at plural points in a similar fashion as the DC breakers.

The aforementioned DC voltage applied via the DC supply line Wdc is lower in voltage than the AC power source AC such as a commercial power source. The single DC supply line Wdc has an upper limit of current flowing therethrough.

Therefore, it is difficult to supply enough power to a home electrical device having relatively high power consumption from the DC power source. Especially, in the case of a high power electrical device (e.g. a laundry machine and the like), a heat generating electrical device (e.g. a rice cooker, a microwave oven, and the like), and a big-screen TV receiver, the AC power is required.

These types of the electrical device is supplied the AC power to via an AC supply line (not shown) connected to a branch breaker (not shown) which is placed in the distribution panel 110 together with the main breaker 111. The AC supply line is connected to an outlet (not shown) preliminarily provided as a wall outlet, a floor outlet, or a ceiling-mounted hooking receptacle, for example. The electric device is connected to a power cord having a power plug (not shown) and is supplied AC power by connecting the power plug to the outlet. It is noted that the DC breaker 114 may have a function of communicating with the electrical device K101 or the outlet via the AC supply line. With the inclusion of this function, the home network can be extended to cover an electric device activated by the AC power.

In the instance shown in FIG. 7, only one AC/DC converter 112 is provided. However, a plurality of AC/DC converters 112 may be connected in parallel to each other. When the plurality of the AC/DC converters 112 is provided, it is preferred to vary the number of the AC/DC converters 112 being activated in accordance with a magnitude of the load.

The aforementioned AC/DC converter 112, cooperation control unit 113, DC breaker 114, solar cell 161, secondary cell 162, and fuel cell 163 respectively are provided with a communication function. Therefore, the linked operation can be performed in response to status of each of the main power source, dispersed power source, and loads including the DC device 102. Like a communication signal used for the DC device 102, a communication signal used by the communication function is transmitted by being superimposed on DC voltage.

In the instance shown in FIG. 7, in order to convert AC power output from the main breaker 111 into DC power, the AC/DC converter 112 is placed in the distribution panel 110. However, the AC/DC converter 112 is not necessarily placed in the distribution panel 110. For example, branch breakers (not shown) may be connected to an output side of the main breaker 111 in the distribution panel 110 such that a plurality of systems is branched off from an AC supply line, and an AC/DC converter may be provided to an AC supply line of each of the systems. That is, each system may be provided with an apparatus configured to convert AC power into DC power. In this instance, it is possible to provide the DC supply unit 101 to each unit such as a floor or room of the house H. Accordingly, it is possible to manage the DC supply unit 101 for each system. In addition, it is possible to shorten a distance between the DC supply unit 101 and the DC device 102 configured to utilize DC power. Therefore, it is possible to reduce power loss caused by a voltage drop which occurs in the DC supply line Wdc. Alternatively, the main breaker 111 and branch breaker may be housed in the distribution panel 110, and the AC/DC converter 112, cooperative control unit 113, DC breaker 114, and home server 116 may be placed in another panel different from the distribution panel 110.

The invention claimed is:

1. An outlet comprising:
a plurality of blade receiving members adapted in use to be connected respectively to a plurality of DC supply lines, and to be connected respectively to a plurality of blades of an outlet plug; and
a wiring detecting means,
wherein said outlet is configured to supply DC power from the plurality of said DC supply lines to said outlet plug via the plurality of said blade receiving members, and
wherein said wiring detecting means being configured to determine proper wiring when the plurality of said DC supply lines is connected respectively to the plurality of said blade receiving members at proper polarity, and to determine improper wiring when the plurality of said DC supply lines is connected respectively to the plurality of said blade receiving members at improper polarity.

2. An outlet as set forth in claim 1, wherein
said outlet comprises an alarm configured to, when said wiring detecting means detects the improper wiring, make notification of the improper wiring.

3. An outlet as set forth in claim 1, further comprising:
a power supply control unit configured to supply DC power to said outlet plug when said wiring detecting means does not detect the improper wiring.

4. An outlet as set forth in claim 2, further comprising:
a power supply control unit configured to supply DC power to said outlet plug when said wiring detecting means does not detect the improper wiring.

5. An outlet as set forth in claim 2, wherein
said outlet further comprises a plurality of power terminals,
said plurality of said blade receiving members including a first blade receiving member configured to receive the blade connected to a high potential side, and a second blade receiving member configured to receive the blade connected to a low potential side,
said plurality of said power terminals including a first power terminal connected to said first blade receiving member, and a second power terminal connected to said second blade receiving member,
said wiring detecting means being configured to act as said alarm, and
said wiring detecting means including a light emitting diode having its anode terminal electrically connected to said second power terminal and its cathode terminal electrically connected to said first power terminal.

6. An outlet as set forth in claim 2, wherein
said outlet further comprises a plurality of power terminals,
said plurality of said blade receiving members including a first blade receiving member configured to receive the blade connected to a high potential side, and a second blade receiving member configured to receive the blade connected to a low potential side,
said plurality of said power terminals including a first power terminal connected to said first blade receiving member, and a second power terminal connected to said second blade receiving member,
said wiring detecting means including a diode having its anode terminal electrically connected to said second power terminal and its cathode terminal electrically connected to said first power terminal,
said alarm including a buzzer interposed between said anode terminal of said diode and said second power terminal, and
said buzzer being configured to generate predetermined sound when energized.

* * * * *